(12) United States Patent
Kase

(10) Patent No.: US 7,109,782 B2
(45) Date of Patent: Sep. 19, 2006

(54) WELL BIAS VOLTAGE GENERATOR

(75) Inventor: Kiyoshi Kase, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 130 days.

(21) Appl. No.: 10/958,831

(22) Filed: Oct. 5, 2004

(65) Prior Publication Data

US 2006/0071702 A1   Apr. 6, 2006

(51) Int. Cl.
*G05F 1/10* (2006.01)
(52) U.S. Cl. .................. 327/534; 327/543; 327/536
(58) Field of Classification Search .............. 323/315, 323/316; 327/512, 513, 530, 534, 535, 536, 327/537, 538, 540, 541, 543
See application file for complete search history.

(56) References Cited

U.S. PATENT DOCUMENTS

| 6,172,554 B1 | 1/2001 | Young et al. | |
|---|---|---|---|
| 6,198,343 B1 * | 3/2001 | Matsuoka | 327/543 |
| 6,486,727 B1 | 11/2002 | Kwong | |
| 6,496,057 B1 * | 12/2002 | Wada et al. | 327/543 |
| 6,498,737 B1 | 12/2002 | Kuo | |
| 6,833,749 B1 * | 12/2004 | Erstad | 327/534 |
| 6,885,234 B1 * | 4/2005 | Ando | 327/534 |

OTHER PUBLICATIONS

Ami Agarwal, et al., "Leakage in Nano-Scale Technologies: Mechanisms, Impact and Design Considerations," Proceedings of the 41st Annual Conference on Design Automatyion, San Diego, CA, Jun. 7-11, 2004, pp. 6-11.

* cited by examiner

*Primary Examiner*—Jeffrey Zweizig

(57) ABSTRACT

A well bias module outputs a voltage used to bias the wells of transistors or other semiconductor components. The well bias module includes a feedback loop having a voltage generation module and a subthreshold leakage sense module that is operable to model the transistors or other semiconductor components so as to sense the subthreshold leakage resulting from a particular well bias voltage output by the voltage generation module. The subthreshold leakage sense module provides a representation of the sensed subthreshold leakage to the voltage generation module, which adjusts the magnitude of the well bias voltage based on this representation so as to reduce or minimize the subthreshold leakage in the transistors or other semiconductor components.

17 Claims, 3 Drawing Sheets

WELL BIAS VOLTAGE GENERATOR

FIELD OF THE DISCLOSURE

The present disclosure relates generally to semiconductor devices, and more particularly to biasing semiconductor devices.

BACKGROUND

Transistors and similar semiconductor components have been scaled to increasingly smaller dimensions. As a result of this scaling, leakage currents have become a significant source of power consumption in devices. The power consumption resulting from leakage currents is of particular concern in devices having finite power available, such as battery-powered portable devices.

When transistors are in an off state (i.e., when the gate-to-source voltage $V_{gs}$ is less than the threshold voltage $V_{th}$ of the transistor), the current flow between the drain and the source of a transistor resulting from the diffusion of minority carriers in the well of the transistor is a substantial source of leakage current commonly referred to as the subthreshold leakage. To reduce the subthreshold leakage, the well of the transistor may be biased by a well bias voltage $V_{wb}$ provided by a voltage source. However, it will be appreciated that the voltage source consumes power while providing the well bias voltage $V_{wb}$. Thus, if the voltage source is operated to provide a well bias voltage so that the voltage source itself operates inefficiently, the reduction in the subthreshold leakage by providing the well bias voltage $V_{wb}$ may be offset by the excessive power consumption by the voltage source providing the well bias voltage $V_{wb}$.

Conventional approaches attempt to solve this discrepancy by maintaining the well bias voltage at a particular voltage value through a voltage monitoring process. However, these techniques fail to account for process and temperature variations which may cause excess power consumption at the preselected well bias voltage. Accordingly, a technique for biasing semiconductor components that improves power consumption would be advantageous.

DETAILED DESCRIPTION OF THE DRAWINGS

FIGS. 1–6 illustrate exemplary techniques for biasing the wells of transistors or other semiconductor components so as to reduce current leakages. In at least one embodiment, a subthreshold leakage sense module is operable to model the transistors so as to sense the subthreshold leakage resulting from a particular well bias voltage used to bias the wells of the transistors. The subthreshold leakage sense module provides a representation of the sensed subthreshold leakage which is used by a voltage generation module to adjust the well bias voltage so as to reduce or minimize the subthreshold leakage in the transistors. Although the biasing of transistors is illustrated herein for ease of reference, those skilled in the art may implement the disclosed techniques to bias other semiconductor components using the guidelines provided herein.

Figure 1:
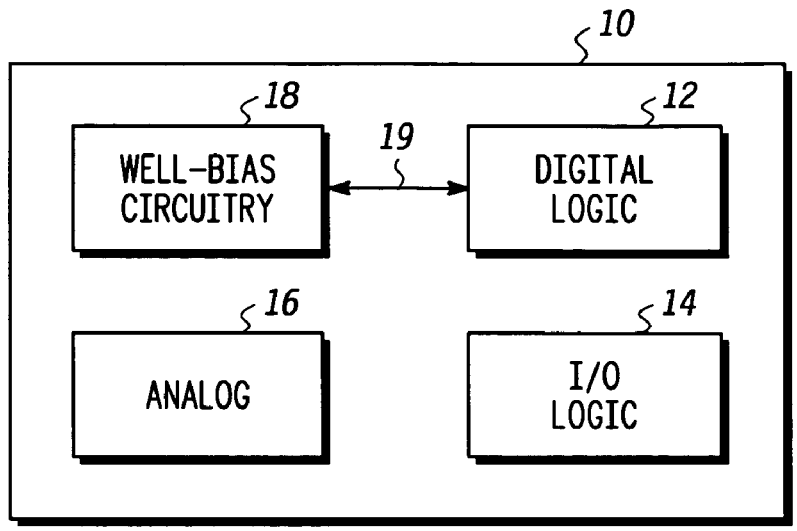
FIG. 1 is a block diagram illustrating an integrated circuit comprising a well bias module to bias the well regions of one or more portions of the integrated circuit in accordance with at least one embodiment of the present disclosure.

Referring now to FIG. 1, an exemplary integrated circuit 10 is illustrated in accordance with at least one embodiment of the present disclosure. The integrated circuit 10 comprises a well bias module 18 configured to provide a well bias voltage 19 to bias the wells of one or more portions of digital logic 12. The integrated circuit 10 may further comprise input/output (I/O) logic 14 to receive or provide signals and analog circuitry 16.

The well bias module 18 may provide the well bias voltage 19 to the well regions of one or more transistors or other semiconductor components of digital logic 12 so as to reduce or minimize leakage currents present in the devices of digital logic 12. Although FIG. 1 illustrates a single well bias module 18 providing a single well bias voltage 19 to the digital logic 12, multiple well bias modules 18 may be implemented to provide multiple well bias voltages to different portions of the digital logic 12. In at least one embodiment, the well bias module 18 comprises a feedback loop whereby a subthreshold leakage expected at the digital logic 12 is monitored and the voltage level of the well bias voltage 19 output by the well bias module 18 may be increased or decreased accordingly. The use of this feedback loop based on the subthreshold leakage compensates for temperature and process variations which often cause a device utilizing a conventional well biasing technique based on a set or predetermined well bias voltage to operate with excess current draw and, therefore, excess power consumption. FIGS. 2-6 illustrate exemplary implementations and techniques related to this feedback loop.

Figure 2:
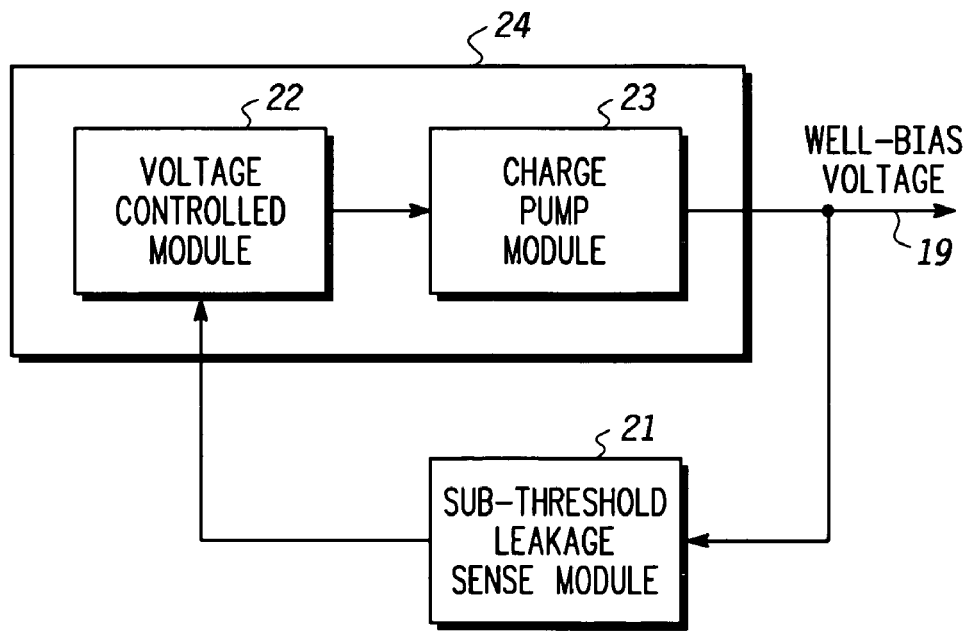
FIG. 2 is a block diagram illustrating an exemplary implementation of the well bias module of FIG. 1 in accordance with at least one embodiment of the present disclosure.

Referring now to FIG. 2, an exemplary implementation of the well bias module 18 is illustrated in greater detail. The well bias module 18 may comprise a voltage generation module 24 for generating and providing the well bias voltage 19 to the digital logic 12. The well bias module 18 may further comprise a subthreshold leakage sense module 21 having an input operably coupled to the output of the voltage generation module 24 to receive the well bias voltage 19, or a representation thereof, and further having an output operably coupled to an input of the voltage generation module 24. In at least one embodiment, the subthreshold leakage sense module 21 is operable to measure or otherwise sense a subthreshold leakage as would be expected in the transistors or other semiconductor components so as to model such components of digital logic 12 having wells biased by the bias voltage 19. Based on the subthreshold leakage sensed in the model transistors, the subthreshold leakage sense module 21 provides an output representative of the sensed subthreshold leakage to the voltage generation module 24 so as to modify the well bias voltage 19 based on the sensed subthreshold leakage.

As illustrated, the voltage generation module 24 may comprise a voltage control module 22 to receive the output of the subthreshold leakage sense module 21 and to provide a representative output signal to the charge pump module 23. Based on this representative output signal, the charge pump module 23 adjusts or modifies the well bias voltage 19 output by the charge pump module 23. For example, the voltage control module 22 may comprise an oscillator, such as a ring oscillator, to provide an output frequency dependant on the output signal of the subthreshold leakage sense module 21. The charge pump module 23 may adjust the magnitude of the well bias voltage 19 based on the frequency of the output frequency of the voltage control module 22. As such, the voltage generation module 24 and the subthreshold leakage sense module 21 form a feedback loop whereby a change in the well bias voltage 19 output by the voltage generation module 24 results in a change in the subthreshold leakage of the transistors or other semiconductor components modeled by the subthreshold leakage sense module 21. The subthreshold leakage sense module 21 senses the change in the subthreshold leakage and changes the value of its output accordingly. A change in the output signal of the subthreshold leakage sense module 21 causes the voltage generator module 24 to modify the output well bias voltage 19 accordingly.

Figure 3:
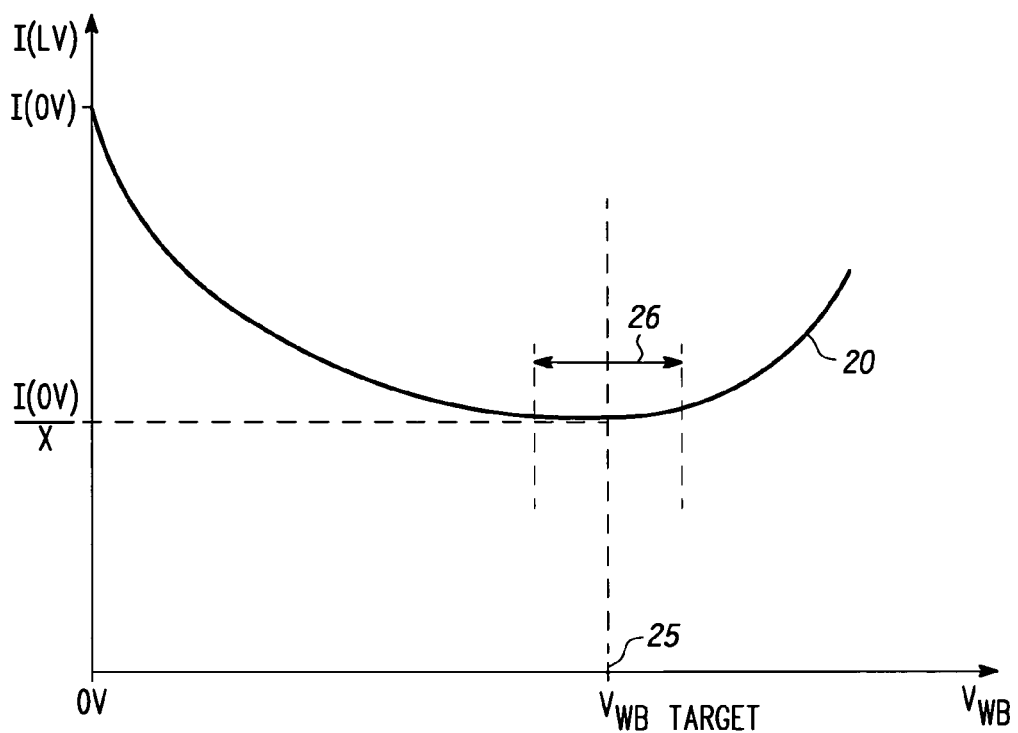
FIG. 3 is a graph illustrating power consumption of a device in accordance with at least one embodiment of the present disclosure.

Referring now to FIG. 3, a graph illustrating an exemplary technique for maintaining the power consumption of the voltage generation module 24 and the transistors having wells biased by the voltage generation module 24 within a predetermined threshold is illustrated.

The ordinate of the chart of FIG. 3 represents the total current draw of the transistors of digital logic 12 (FIG. 1) and the charge pump 23 of the voltage generation module 24 (FIG. 2) while the digital logic portions are in a low-power state, such as when transistors are biased to have subthreshold gate voltages, which can occur in a stand-by or sleep mode. The abscissa of the chart of FIG. 3 represents the magnitude of the well bias voltage provided by the charge pump 23 to the wells containing the digital logic 12. Line 20 represents an exemplary representation of total current draw of the digital logic 12 and well bias circuitry 18 as a function of the well bias voltage.

As will be understood by one skilled in the art, voltage supply devices, such as charge pump 23, often become less efficient as the voltage supplied increases. As the efficiency of the voltage supply device decreases, the current drawn (and thus the power consumed) by the voltage supply device increases. Accordingly, while providing a well bias voltage with a higher magnitude may reduce or minimize subthreshold currents, the current drawn by the voltage supply device to provide such a high well bias voltage may offset, or even exceed, the subthreshold leakage reduction achieved by the higher well bias voltage. As the line 20 illustrates, a reduction in the total current draw may be achieved by biasing wells of using the well bias voltage. As the well bias voltage increases to a target well bias voltage 25, the total current drawn by the transistors of digital logic 12 is reduced. However, as the well bias voltage increases past this target voltage point, inefficiencies in the charge pump 23 may result in an increased overall current draw thereby reducing or negating the benefit of providing a well bias voltage.

Thus, in at least one embodiment, the well bias module 18 may be configured to employ a feedback loop based on sensed subthreshold leakage, as described herein, so as to maintain the well bias voltage 19 within a threshold 26 around the target well bias voltage 25, which may change due to process or temperature variances. Accordingly, the power consumed by the voltage generation module 24 and the transistors of digital logic 12 having their wells biased by the well bias voltage 19 may be maintained closer to the minimum power consumption achievable. Moreover, it will be appreciated that the target well bias voltage 26 may change due to process or temperature variations in the charge pump or the transistors. By sensing the subthreshold leakage and modifying the well bias voltage accordingly, the power consumption may be maintained closer to the minimum power consumption independent of the process or temperature variations, whereas conventional techniques which maintain a set well bias voltage are susceptible to such variations.

Figure 4:
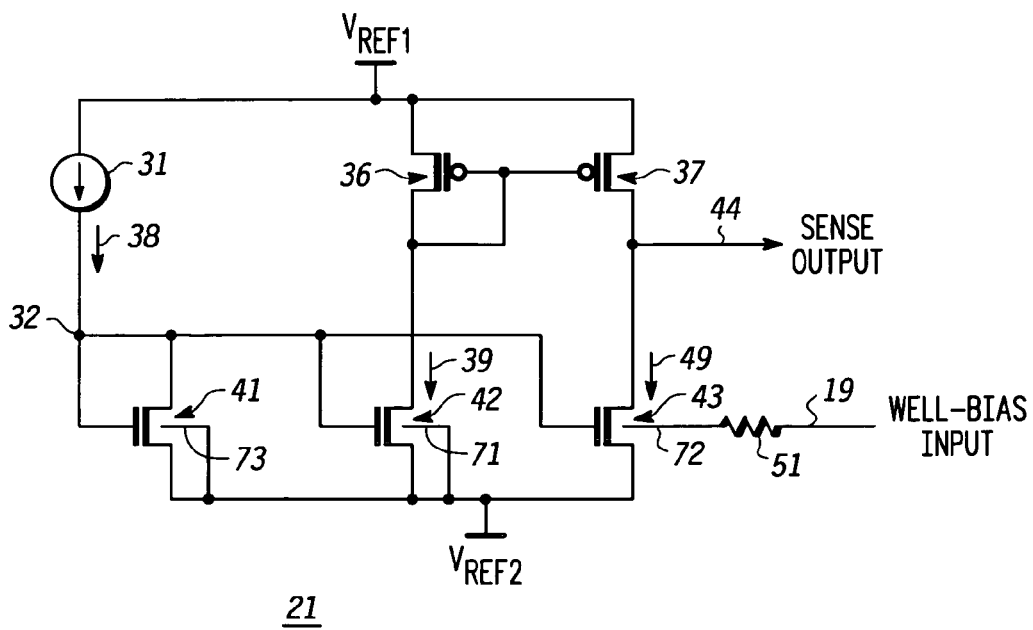
FIG. 4 is an exemplary circuit diagram illustrating a subthreshold leakage sense module in accordance with at least one embodiment of the present disclosure.

Referring now to FIG. 4, a circuit diagram illustrating an exemplary implementation of the subthreshold leakage sense module 21 of FIG. 2 is illustrated in accordance with at least one embodiment of the present disclosure. The module 21 may comprise a bias current generator 31 having an input coupled to a voltage reference $V_{REF1}$ and an output coupled to a node 32. In at least one embodiment, the bias current generator 31 is operable to provide a relatively small current $i_b$, e.g., on the order of one hundred nanoamperes to bias transistor 41 at the subthreshold voltage, and may be implemented as, for example, a resistance or a diode-connected transistor. The module 21 further may comprise a current mirror implemented by p-type transistors 36 and 37. The p-type transistor 36 includes a first current electrode (e.g., the source) operably coupled to the voltage $V_{REF1}$ and a control node (e.g., the gate) operably coupled a second current electrode (e.g., the drain). The p-type transistor 37 includes a first current electrode operably coupled to the voltage $V_{REF1}$, a control input operably coupled to the control node of the p-type transistor 36, and a second current electrode operably coupled to a sense output 44. The sense output 44 is operably coupled to the input of the voltage generation module 24 (FIG. 2).

The module 21 further comprises n-type transistors 41, 42 and 43. The transistor 41 includes a control node (e.g., a gate) and first current electrode (e.g., a drain) operably coupled to the output of the bias current generator 31 (e.g., via the node 32) and a second current electrode operably coupled to a voltage $V_{REF2}$. The well 73 of the transistor 41 is coupled to the voltage $V_{REF2}$. The transistor 42 has a first current electrode operably coupled to the voltage $V_{REF2}$, a control node operably coupled to the output of the bias current generator 31 (e.g., via node 32) and a second current electrode operably coupled to the second current electrode of the p-type transistor 36 of the current mirror. As with the transistor 41, the well 71 of the transistor 42 is biased by the voltage $V_{REF2}$. In one embodiment, the wells 71 and 73 may be implemented as a common shared well or the wells 71 and 73 may be implemented as separate wells isolated from each other, as discussed in greater detail below with reference to FIG. 5.

The transistor 43 comprises a first current electrode (e.g., a drain) operably coupled to the second current electrode of the p-type transistor 37 of the current mirror, a second current electrode (e.g., a source) operably coupled to the voltage $V_{REF2}$, and a control node (e.g., a gate) operably coupled to the output of the bias current generator 31. Unlike transistors 41 and 42, the well 72 of the transistor 43 is biased by a representation of the well bias voltage 19 provided by the voltage generation module 24 (FIG. 2). As illustrated, a resistance 51 may be disposed between the well 72 of the transistor 43 and the input providing the well bias voltage 19 so as to filter noise and other transient effects.

In operation, the bias current generator 31 produces a current 38 (also referred to herein as $i_d$) wherein the current 38 is of a relatively small magnitude typically on the order of one hundred nano amperes. As a result of the current 38, a voltage $V_{gs}$ is produced at node 32, which therefore produces the voltage $V_{gs}$ at a current electrode (e.g., the drain) of the transistor 41, as well as the control nodes of transistors 41–43. The current 38 is chosen to be low enough to allow the resulting voltage $V_{gs}$ to be approximately equivalent to the threshold voltage $V_{th}$ of the transistors 41–43. Consequently, a current 39 (also referred to herein as $i_r$) is produced at the transistor 42, where the current 39 is approximately equal to (or proportional to) the current 38 when the voltage $V_{gs}$ is approximately equal to the threshold voltage $V_{th}$. Because the control node of the transistor 42 is approximately equal to the threshold voltage $V_{th}$ of the transistor 42, the resulting current 39 transmitted through the transmitter 42 is represented by the bias current 38 and the subthreshold leakage present in the transistor 42.

As a result of the current mirror represented by p-type transistors 36 and 37, a predetermined current 49 is transmitted through the transistor 43. In one embodiment, the gate width of the transistor 43 is N times larger than the gate width of the transistor 42, where N is a real number preferably greater than one and less than a thousand and more preferably greater than one and less than twenty. In another embodiment, the width-to-length ratio of the gate of transistor 43 is N times larger than the width-to-length ratio of the gate of the transistor 42. Accordingly, the ratio of the current 49 to the current 39 is approximately equivalent to the ratio N of the gate width of the transistor 43 to the gate width of the transistor 42, so the current 49 substantially represents N time the bias current 38 (i.e., $N*i_b$) in addition to the subthreshold leakage present in the transistor 42.

The subthreshold leakage of the transistor 43 changes depending on the magnitude of the well bias voltage 19 that biases the well 72 of the transistor 43. Accordingly, as the well bias voltage 19 increases and approaches the target well bias voltage 26 (FIG. 3), the subthreshold leakage of the transistor 43 is reduced and the current 49 therefore decreases, resulting in an increase in the voltage at the sense output 44 (the p-type transistor 37, the source output 44 and the transistor 43 form, in essence, a voltage divider having a gain equivalent to the impedances of the transistors 37 and 43 in parallel). As the voltage of the sense output 44 increases, the well bias voltage 19 output by the voltage generation module 24 decreases. Conversely, as the well bias voltage 19 decreases away from the target well bias voltage 25, the subthreshold leakage of the transistor 43 is increased and the current 49 therefore increases, resulting in a decrease in the voltage at the sense output 44. As the voltage of the sense output 44 increases, the well bias voltage 19 output by the voltage generation module 24 decreases. Accordingly, the well bias voltage 19 may be maintained at or near a voltage whereby the subthreshold leakage in the transistor 43 is reduced or minimized.

As FIG. 4 illustrates, the subthreshold leakage sense module 21 may model or simulate the operation of the transistors of the digital logic 12 (FIG. 1) so as to measure or sense the subthreshold leakage in the transistors. The transistors of digital logic 12 may be modeled by utilizing as transistor 43 a transistor of a same or similar type as the transistors of digital logic and by biasing the well 71 of the transistor 73 with the same or similar well bias voltage 19 used to bias the wells of the transistors of the digital logic 12. Accordingly, the transistor 43 typically exhibits the same subthreshold leakage characteristics as the transistors of the digital logic 12. By comparing these subthreshold leakage characteristics with the characteristics of the transistor 42, which is not biased by the well bias voltage 19, a relative subthreshold leakage may be sensed and an output to change the well bias voltage 19 accordingly may be provided.

Figure 5:
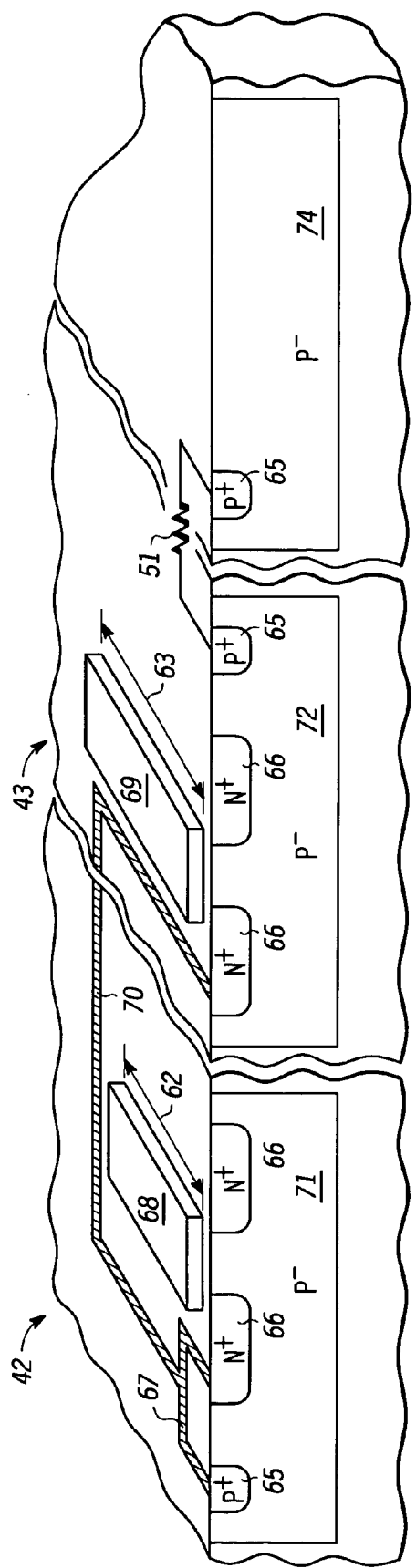
FIG. 5 is a cross-section diagram of a portion of the module illustrated in FIG. 4 in accordance with at least one embodiment of the present disclosure.

Referring now to FIG. 5, an exemplary cross-section of a portion of a circuit substrate that implements the transistors 42 and 43 as well as the resistance 51 and the input for the well bias voltage 19 is illustrated in accordance with one embodiment of the present disclosure. As illustrated, the transistor 42 may be implemented as a lightly doped p-type well 71 having heavily doped n-type regions 66 representing the current electrodes of the transistor 42, and a gate 68 which operates as the control mode for the transistor 42. As illustrated, the heavily doped region 65 acts as a contact to the well region 71 and is itself coupled to a source-drain region of transistor 42 through conductive portion 67 and to a source-drain region of the transistor 43 through the conductive portion 70.

The transistor 43 may be implemented in a lightly doped p-type well 72 having heavily doped n-type regions 66 which represent the current electrodes of the transistor 43, and a gate 69 representing a control input to the transistor 43. As illustrated, the heavily doped region 65 acts as a contact to the well region 71 and is itself coupled to a source-drain region of transistor 42 through conductive portion 67 and to a source-drain region of the transistor 43 through the conductive portion 10. The transistor 43 may further comprise a heavily doped p-type region 65 operably coupled to a lightly doped p-type region 74 via a resistance 51 and a heavily doped p-type region 65. The well bias voltage 19 may be provided, for example, via the p-type region 65 and the resistance 51. In at least one embodiment, the lightly doped p-type region 73 represents the wells of one or more portions of digital logic 12 of FIG. 1. Also as illustrated, the gate 68 of transistor 42 has a gate width 62 and the gate 69 of transistor 43 has a gate width 63 that is N times wider than the gate width 62 of transistor 42, or, alternatively, the width-to-length ratio of the gate 69 is N times greater than the width-to-length ratio of the gate 68. Although the gate width 63 is illustrated as longer, it will be appreciated that the transistor 43 may be implemented as a plurality of transistors connected in parallel so as to have an overall effective gate width 63.

Figure 6:
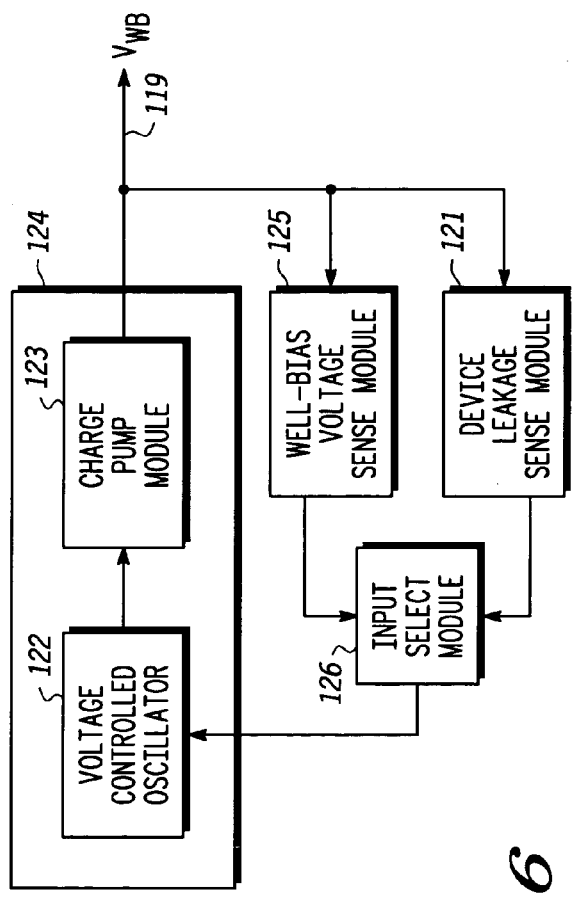
FIG. 6 is a block diagram illustrating another exemplary implementation of the well bias module of FIG. 1 in accordance with at least one embodiment of the present disclosure.

Referring now to FIG. 6, another exemplary implementation of the subthreshold current sense module 21 of FIG. 2 is illustrated in accordance with one embodiment of the present disclosure. As illustrated in FIG. 6, a voltage generation module 124 is operable to output a well bias voltage 119. The well bias voltage 119 is provided to the input of a body effect sense module 121, which may be similar to the subthreshold leakage sense module 21 of FIG. 2, and also is provided to a well bias voltage sense module 125.

In one embodiment, the device leakage sense module 121 is operable to detect or measure body effects resulting from the operation of one or more transistors modeled after the transistors or other semiconductor components of the digital logic 12, as discussed above. The well bias voltage sense module 125 in one embodiment is operable to monitor an output of the charge pump module 123 so as to maintain the charge pump module 123 at an output below a maximum threshold based on an efficiency of the charge pump module 123. The well bias voltage sense module 125 may be implemented, for example, using the techniques disclosed in U.S. Pat. No. 6,498,737 or U.S. Pat. No. 6,172,554. The outputs of the modules 121 and 125 are provided to an input select module 126 where one of the outputs is selected for provision to the voltage control module 122 of the voltage generation module 124. In one embodiment, the input select module 126 is operable to deflect an output of the modules 121 or 125 having the greatest magnitude. Accordingly, in operation the well-bias voltage 119 may be adjusted up or down based on one of the outputs provided by the modules 121 or 125. In instances where the charge pump module 123 may be approaching a maximum threshold, the output of the well bias sense module 125 may be selected by the input select module 126 so as to adjust the magnitude of the well bias voltage 119 downward. In other instances, the output of the body effect sense module 121 may be selected by the input select module 126 so as to provide a well bias voltage 119 so as to reduce or minimize the subthreshold leakage present in the transistors or other semiconductors of digital logic 12 of FIG. 1.

It is understood that the present disclosure is not limited to the disclosed specific embodiments and details, which are exemplary only. It is further understood that one possessing ordinary skill in the art, in light of known systems and methods, would appreciate the use of the disclosure for its intended purposes and benefits in any number of alternative embodiments, depending upon specific design and other needs. For example, although the following disclosure is provided in the context of biasing the wells of transistors, those skilled in the art may utilize the discloses techniques for biasing the wells of other semiconductor components using the guidelines provided herein. Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. An apparatus comprising:
    a first transistor formed at a first well region, the first transistor comprising a first current electrode, a second current electrode coupled to the first well region, and a control node, wherein the first well region is of a first conductivity type;
    a second transistor formed at a second well region that is different than the first well region, the second transistor comprising a first current electrode, a second current electrode coupled to the second current electrode of the first transistor, and a control node coupled to the control node of the first transistor, wherein the second well region is of the first conductivity type;
    a current mirror comprising a first node coupled to the first current electrode of the first transistor and a second node coupled to the first current electrode of the second transistor, wherein a first current is to be provided by the current mirror at the first node and a second current is to be provided by the current mirror at the second node such that a ratio of the first current to the second current is predetermined; and
    a voltage generator comprising an input coupled to the first current electrode of the second transistor and an output coupled to the second well region to provide a well bias voltage based upon a signal value at the input.

2. The apparatus of claim 1, further comprising:
    a current source comprising a first node and a second node coupled to the control electrode of the first transistor.

3. The apparatus of claim 2, further comprising:
    a third transistor comprising a first current electrode coupled to the control electrode of the first transistor, a second current electrode coupled to the second current electrode of the second transistor, and a control electrode coupled to the first current electrode.

4. The apparatus of claim 3, further comprising:
    a resistive element in series between the well region of the second transistor and the output of the voltage generator.

5. The apparatus of claim 3, wherein the third transistor is at a third well region that is different than the second well region.

6. The apparatus of claim 5, wherein the third well region is the same as the first region.

7. The apparatus of claim 5, wherein a well region of the third transistor is a different well region than the first transistor.

8. The apparatus of claim 1, further comprising:
    a resistive element in series between the well region of the second transistor and the output of the voltage generator.

9. The apparatus of claim 1, further comprising:
    a third transistor comprising a first current electrode coupled to the control electrode of the first transistor, a second current electrode coupled to the second current electrode of the second transistor, and a control electrode coupled to the first current electrode.

10. The apparatus of claim 1 wherein a gate width of the second transistor is greater than a gate length of the first transistor.

11. The apparatus of claim 1 wherein a gate width of the second transistor is greater than twice the gate length of the first transistor.

12. A method comprising:
    providing a well bias voltage to a well region;
    biasing a device based upon the well bias voltage; and
    modifying the well bias voltage provided to the well region to compensate for sub-threshold leakage variations over a range of process variations and a range of temperature variations.

13. The apparatus of claim 12, wherein modifying the well bias voltage comprises providing an indication of the sub-threshold leakage to a signal controlled oscillator.

14. An apparatus comprising:
    a well bias voltage sense module comprising an input and an output, the well bias voltage sense module to sense an input signal and provide a control signal at the output based upon a relationship between the input signal and a desired signal;
    a device leakage sense module comprising an input coupled to the input of the voltage sense module and an output, the device leakage sense module to sense a leakage current of a device and provide a control signal at the output based upon a magnitude of the leakage current;
    a select module comprising a first input coupled to the output of the well bias voltage sense module, a second input coupled to the output of the device leakage sense module, and an output to provide a representation of one of a first signal received at the first input or a second signal received at the second input; and
    a signal generator comprising an input coupled to the output of the select module, and an output coupled to the input of the voltage sense module.

15. The apparatus of claim 14, wherein the select module further comprises
    a first transistor formed at a first well region, the first transistor comprising a first current electrode, a second current electrode coupled to the first well region, and a control node, wherein the first well region is of a first conductivity type;

a second transistor formed at a second well region that is different than the first well region, the second transistor comprising a first current electrode, a second current electrode coupled to the second current electrode of the first transistor, and a control node coupled to the control node of the first transistor, wherein the second well region is of the first conductivity type; and a current mirror comprising a first node coupled to the first current electrode of the first transistor, and a second node coupled to the first current electrode of the second transistor, wherein a first current is to be provided by the current mirror at the first node and a second current is to be provided by the current mirror at the second node such that a ratio of the first current to the second current is predetermined.

16. A method comprising:

determining a first leakage current for at least a portion of an apparatus in response to the at least a portion of the apparatus comprising a first well bias voltage;

determining a desired leakage current for the at least a portion of the apparatus; and defining a ratio of a first transistor width to a second transistor width to be approximately equal to the ratio of the first leakage current to the desired leakage current.

17. The apparatus of claim 16, wherein determining the first leakage and determining the desired leakage is determined when the at least a portion of the apparatus is in a low-power mode of operation.

* * * * *